United States Patent
Lee

(10) Patent No.: US 8,295,100 B2
(45) Date of Patent: Oct. 23, 2012

(54) PIPE LATCH CIRCUIT AND METHOD FOR OPERATING THE SAME

(75) Inventor: Hyeng-Ouk Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 345 days.

(21) Appl. No.: 12/779,310

(22) Filed: May 13, 2010

(65) Prior Publication Data

US 2011/0211397 A1   Sep. 1, 2011

(30) Foreign Application Priority Data

Feb. 26, 2010   (KR) .................. 10-2010-0018164

(51) Int. Cl.
*G11C 7/10* (2006.01)
(52) U.S. Cl. .................. 365/189.05; 365/193; 365/219
(58) Field of Classification Search .......... 365/189.05, 365/193, 219, 236, 220, 221
See application file for complete search history.

(56) References Cited

U.S. PATENT DOCUMENTS 7,420,865 B2 * 9/2008 Lee ............................ 365/219
8,023,339 B2 * 9/2011 Kim et al. ............... 365/189.05

FOREIGN PATENT DOCUMENTS

KR   100567527   4/2006
KR   100829455   5/2008

OTHER PUBLICATIONS

Notice of Allowance issued from Korean Intellectual Property Office on Jul. 29, 2011.
Notice of Preliminary Rejection issued from Korean Intellectual Property Office on May 27, 2011.

* cited by examiner

*Primary Examiner* — Gene Auduong
(74) *Attorney, Agent, or Firm* — IP & T Group LLP

(57) ABSTRACT

A pipe latch circuit includes a division unit configured to output a division signal, a multiplexing unit configured to multiplex a plurality of source signals according to periods determined by the division signal and generate a plurality of pipe input control signals, and a pipe latch unit configured to sequentially latch a plurality of data signals in response to the pipe input control signals, wherein the source signals are sequentially activated in response to an input/output (I/O) strobe signal.

15 Claims, 7 Drawing Sheets

PIPE LATCH CIRCUIT AND METHOD FOR OPERATING THE SAME

CROSS-REFERENCE TO RELATED APPLICATION

The present application claims priority of Korean Patent Application No. 10-2010-0018164, filed on Feb. 26, 2010, which is incorporated herein by reference in its entirety.

BACKGROUND OF THE INVENTION

Exemplary embodiments of the present invention relate to a semiconductor design technique, and more particularly, to a pipe latch circuit sequentially latching a plurality of data signals in response to an input/output (I/O) strobe signal.

Semiconductor memory devices such as a double data rate (DDR) synchronous dynamic random access memory (SDRAM) perform read/write operations in response to an instruction externally inputted from a chip set. Among several circuits required to perform the read/write operations, there is a pipe latch circuit for efficiently controlling the data signals. Generally, the pipe latch circuit serially latches the data signals inputted in parallel in response to a pipe input control signal and outputs the data signals in parallel in response to a pipe output control signal.

FIG. 1 is a block diagram illustrating a known semiconductor memory device including a pipe latch circuit.

The semiconductor memory device includes a source signal generation unit 110, a control signal output unit 120, a pipe latch unit 130 including six pipe latches, and a data pad 140.

The source signal generation unit 110 generates a source signal SRC<0:5> reset in response to a reset signal RSTB and sequentially activated in response to an input/output (I/O) strobe signal IO_STBP. Herein, the I/O strobe signal IO_STBP is a control signal for transmitting a data signal loaded on a local I/O line to a global I/O line for the read operation of the semiconductor memory device. The reset signal RSTB for initializing the pipe latches is activated for an initial operation of the semiconductor memory device and a power down mode.

The control signal output unit 120 outputs a pipe input control signal PINB<0:5> based on the source signal SRC<0:5>. The pipe input control signal PINB<0:5> is generated by propagating the source signal SRC<0:5> through a plurality of inverters.

The pipe latch unit 130 sequentially latches the data signals transmitted through the global I/O line GIO in response to the pipe input control signal PINB<0:5> and outputs the data signals to the data pad 140 in response to a pipe output control signal POUT<0:5>. The width, in bits, of the source signal SRC<0:5>, the pipe input control signal PINB<0:5>, and the pipe output control signal POUT<0:5> is equal to the number of the pipe latches included in the pipe latch unit 130. The present embodiment shown in FIG. 1 includes six pipe latches in the pipe latch unit 130, and thus, the source signal SRC<0:5>, the pipe input control signal PINB<0:5>, and the pipe output control signal POUT<0:5> each have a width of six bits.

The control signal output unit 120 and the pipe latch unit 130 are generally arranged in the center of a peripheral area where the data pad 140 is also arranged. The source signal SRC<0:5> generated by the source signal generation unit 110 is transmitted to the control signal output unit 120 through relatively long transmission lines. More specifically, a relatively long transmission line for each bit of the source signal SRC<0:5> is placed in the peripheral area. Therefore, these transmission lines may be a burden when designing the peripheral area.

FIG. 2 is a circuit diagram illustrating the source signal generation unit 110 and the control signal output unit 120 shown in FIG. 1.

The source signal generation unit 110 includes a shift unit 210, a delay unit 220, and an output unit 230. The shift unit 210 is reset in response to the reset signal RSTB, and generates a shift signal K<0:5> in response to the I/O strobe signal IO_STBP. The shift unit 210 includes six flip-flops for generating the shift signal K<0:5> with a width of six bits. The delay unit 220 delays the I/O strobe signal IO_STBP, and generates a delayed I/O strobe signal D_STBP. The output unit 230 generates the source signal SRC<0:5> based on the shift signal K<0:5> in response to the delayed I/O strobe signal D_STBP. The control signal output unit 120 includes a plurality of inverters for generating the pipe input control signal PINB<0:5> based on the source signal SRC<0:5>.

FIG. 3 is a waveform diagram illustrating an operation of the source signal generation unit 110 shown in FIG. 2.

The shift unit 210 performs a shift operation in response to the I/O strobe signal IO_STBP, and accordingly, each bit of the shift signal K<0:5> is sequentially activated. Before performing the shift operation, the flip-flops are reset in response to the reset signal RSTB. The sixth shift signal K<5> is reset to a logic high level and the other shift signals K<0:4> are reset to a logic low level.

The I/O strobe signal IO_STBP is delayed by the delay unit 220 and outputted as the delayed I/O strobe signal D_STBP. The delayed I/O strobe signal D_STBP and the shift signal K<0:5> are combined by the output unit 230 to generate the source signal SRC<0:5>. The reason for generating the source signal SRC<0:5> by using the delayed I/O strobe signal D_STBP instead of the I/O strobe signal IO_STBP is to obtain a margin for combining the shift signal K<0:5>. The source signal SRC<0:5> is outputted as the pipe input control signal PINB<0:5> by the control signal output unit 120.

The pipe latch unit 130 sequentially latches the data signals inputted through the global I/O line in response to the pipe input control signal PINB<0:5>, and outputs the data signals to the data pad 140 in response to the pipe output control signal POUT<0:5>.

As the semiconductor memory device is improved to perform high speed operations and to store a large amount of information, the number of the pipe latches required in the pipe latch unit increases. When the number of the pipe latches increases, the width of the source signal SRC<0:5> and the pipe input control signal PINB<0:5> increases, and accordingly, the number of the transmission lines for transmitting the source signal SRC<0:5> and the pipe input control signal PINB<0:5> also increases. Moreover, the length of the transmission lines for transmitting the source signal SRC<0:5> to the control signal output unit 120 is relatively long. Therefore, the increase of the number of the relatively long transmission lines contributes to the undesired increase of the peripheral area and the chip size of the semiconductor memory devices.

SUMMARY OF THE INVENTION

Exemplary embodiments of the present invention are directed to a semiconductor memory device including a pipe latch circuit and an operation method thereof capable of reducing the chip size by minimizing the number of transmission lines.

In accordance with an embodiment of the present invention, a pipe latch circuit includes a division unit configured to output a division signal, a multiplexing unit configured to multiplex a plurality of source signals according to periods determined by the division signal and generate a plurality of pipe input control signals, and a pipe latch unit configured to sequentially latch a plurality of data signals in response to the pipe input control signals, where the source signals are sequentially activated in response to an input/output (I/O) strobe signal.

In accordance with another embodiment of the present invention, an operation method of a pipe latch circuit includes outputting a first count value, generated by counting an I/O strobe signal during a first period where a division signal has a first logic level, as a plurality of first pipe input control signals, outputting a second count value, generated by counting the I/O strobe signal during a second period where the division signal has a second logic level, as a plurality of second pipe input control signals, and sequentially latching a plurality of data signals in response to the first and second pipe input control signals.

DESCRIPTION OF SPECIFIC EMBODIMENTS

Figure 1:
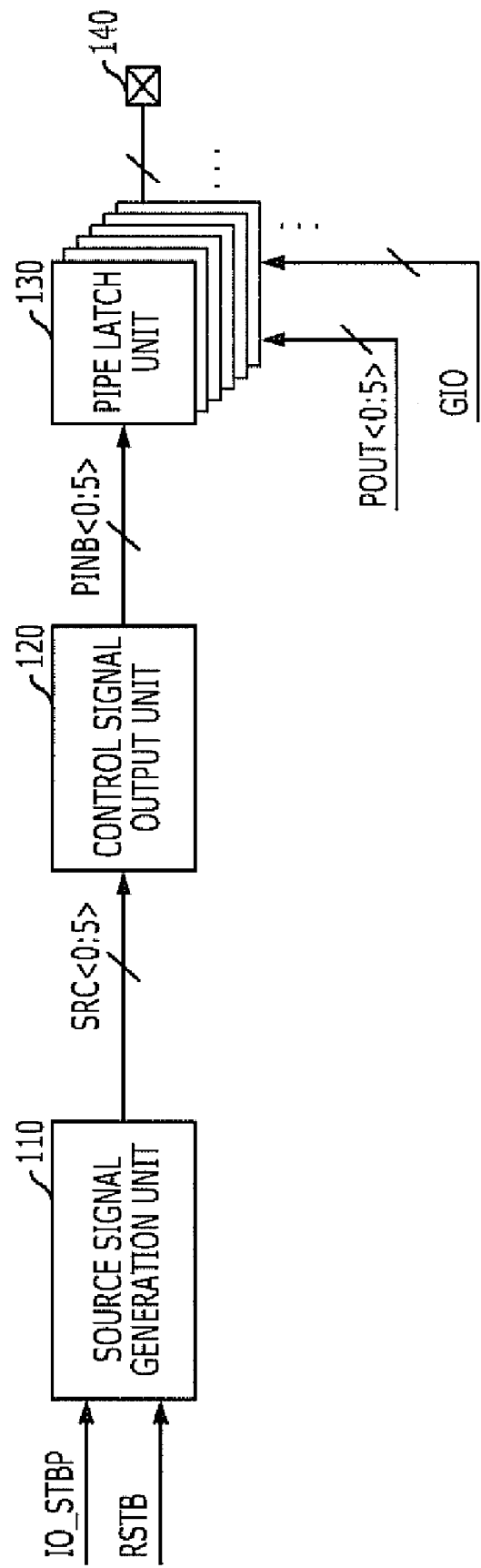
FIG. 1 is a block diagram illustrating a known semiconductor memory device including a pipe latch circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
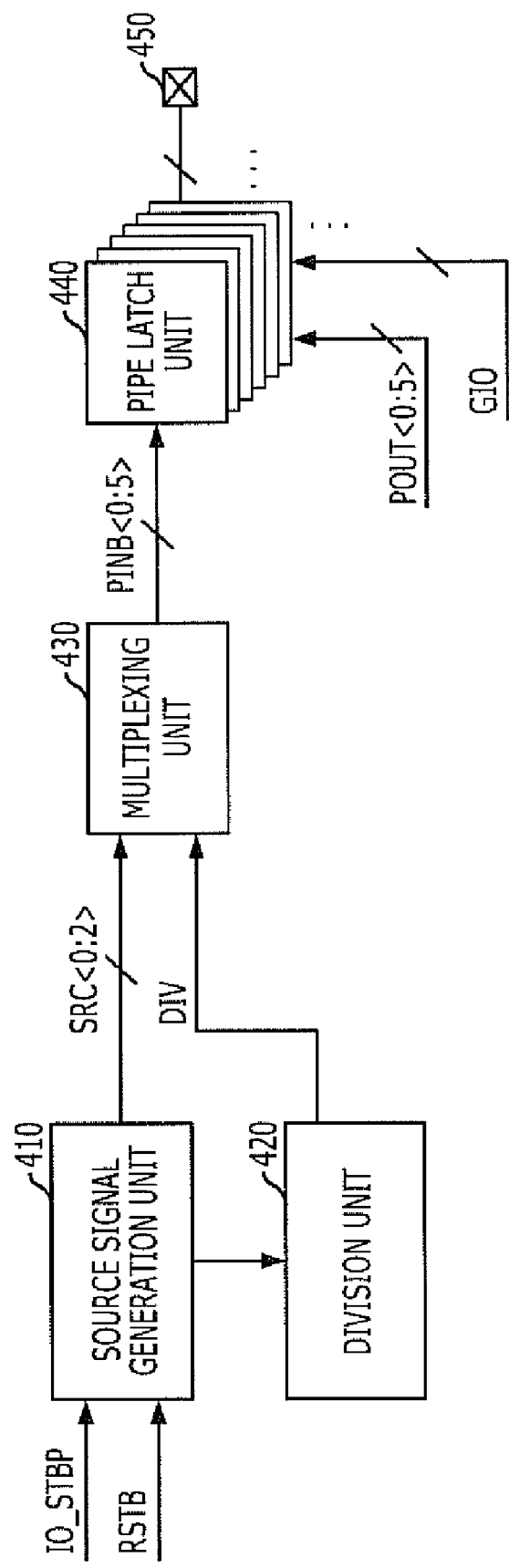
FIG. 4 is a block diagram illustrating a semiconductor memory device including a pipe latch circuit in accordance with an embodiment of the present invention.

FIG. 4 is a block diagram illustrating a semiconductor memory device including a pipe latch circuit in accordance with an embodiment of the present invention.

The semiconductor memory device includes a source signal generation unit 410, a division unit 420, a multiplexing unit 430, a pipe latch unit 440 including six pipe latches, and a data pad 450.

The source signal generation unit 410 generates a source signal SRC<0:2> that is reset in response to a reset signal RSTB and that is sequentially activated in response to an input/output (I/O) strobe signal IO_STBP. Herein, for example, the source signal SRC<0:2> has a width of three bits while the pipe latch unit 440 has six pipe latches. The division unit 420 divides the I/O strobe signal IO_STBP and generates a division signal DIV. The multiplexing unit 430 generates a pipe input control signal PINB<0:5> having a six bit width based on the source signal SRC<0:2> having a three bit width in response to the division signal DIV. The pipe latch unit 440 sequentially latches the data signals transmitted through the global I/O line GIO in response to the pipe input control signal PINB<0:5>, and outputs the data signals to the data pad 450 in response to a pipe output control signal POUT<0:5>.

The multiplexing unit 430 and the pipe latch unit 440 are generally arranged in the center of a peripheral area where the data pad 450 is also arranged. The source signal SRC<0:2> generated by the source signal generation unit 410 is transmitted to the multiplexing unit 430 through relatively long transmission lines. That is, three long transmission lines for each bit of the source signal SRC<0:2> are placed in the peripheral area. Compared to the known semiconductor memory device shown in FIG. 1, the semiconductor memory device of FIG. 4 includes only half the number of transmission lines for transmitting a source signal. As a result, it is possible to reduce the size of the peripheral area.

Figure 5:
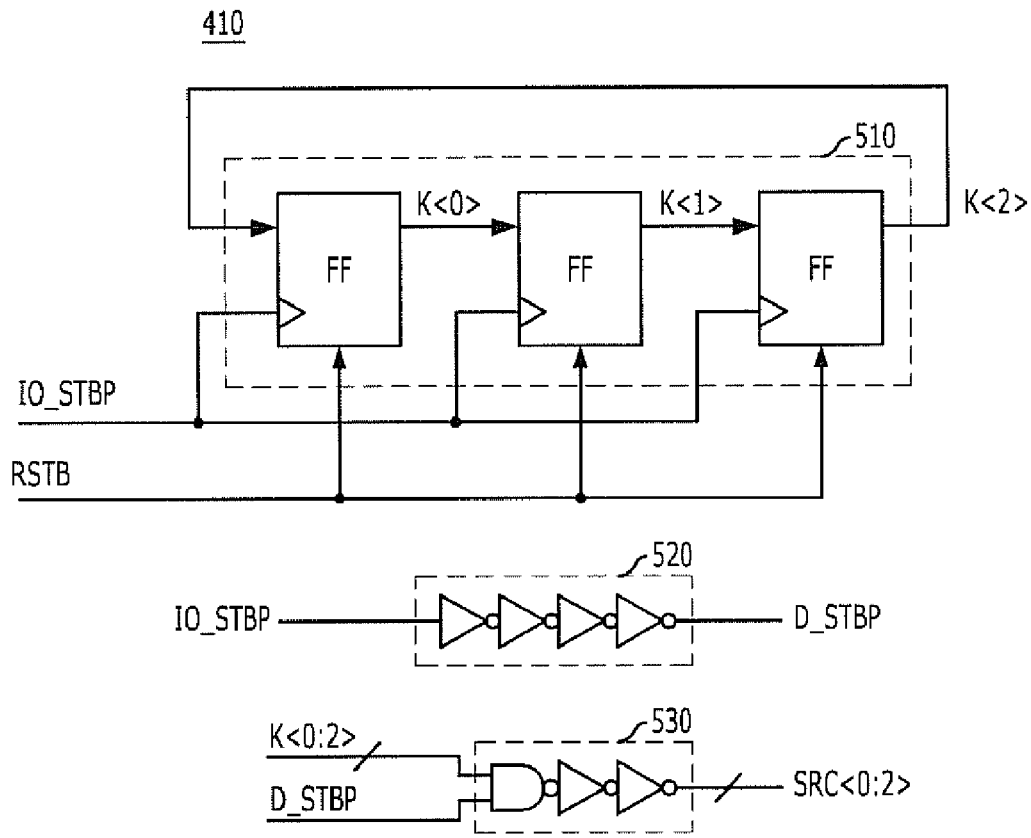
FIG. 5 is a circuit diagram illustrating a source signal generation unit shown in FIG. 4.

FIG. 5 is a circuit diagram illustrating the source signal generation unit 410 shown in FIG. 4.

Figure 2:
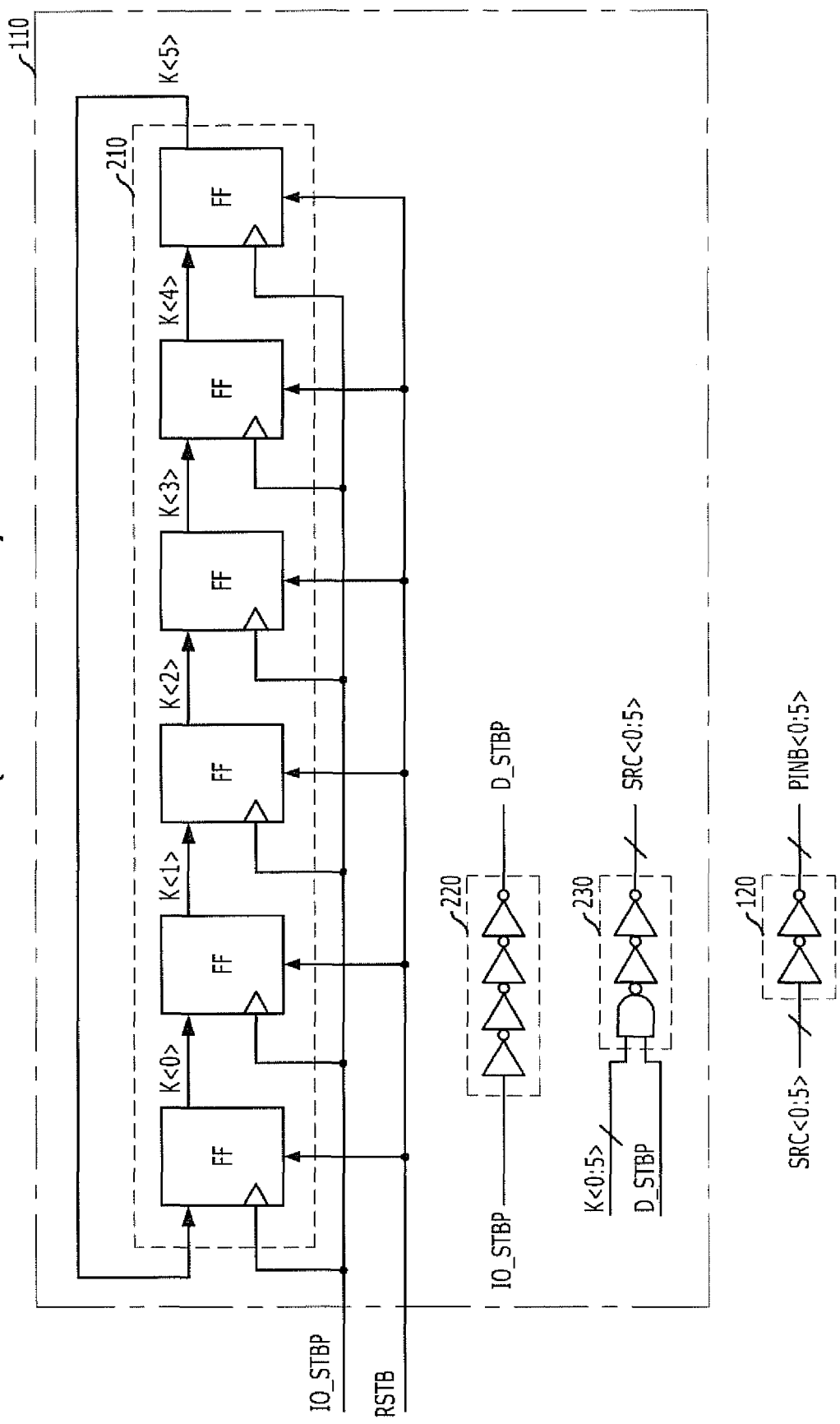
FIG. 2 is a circuit diagram illustrating a source signal generation unit and a control signal output unit shown in FIG. 1.
Figure 3:
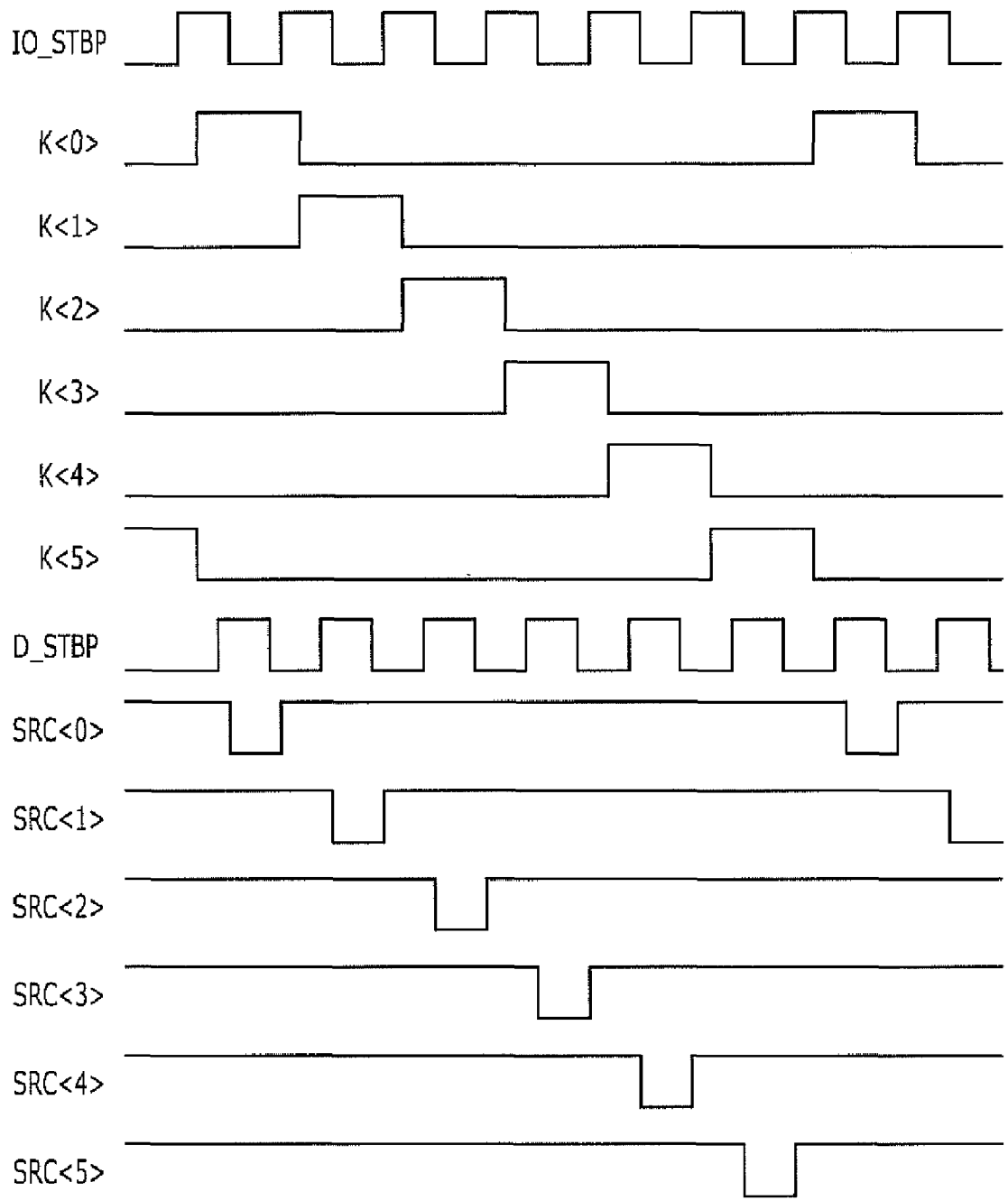
FIG. 3 is a waveform diagram illustrating an operation of the source signal generation unit shown in FIG. 2.

The source signal generation unit 410 includes a shift unit 510, a delay unit 520, and an output unit 530. The shift unit 510 is reset in response to the reset signal RSTB and generates a shift signal K<0:2> in response to the I/O strobe signal IO_STBP. The shift unit 510 includes three flip-flops for generating the shift signal K<0:2> having a three bit width. Compared to the known shift unit 210 shown in FIG. 2, the shift unit 510 of FIG. 5 includes only half the number of flip-flops. The delay unit 520 delays the I/O strobe signal IO_STBP by, for example, using one or more inverters, and generates a delayed I/O strobe signal D_STBP. The output unit 530 generates the source signal SRC<0:2> based on the shift signal K<0:2> in response to the delayed I/O strobe signal D_STBP.

Figure 6:
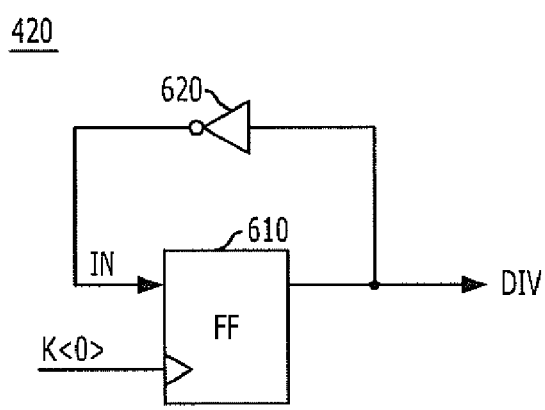
FIG. 6 is a circuit diagram illustrating a division unit shown in FIG. 4.

FIG. 6 is a circuit diagram illustrating the division unit 420 shown in FIG. 4.

The division unit 420 includes a latch unit 610 and a feedback unit 620. The latch unit 610 latches an input signal IN in response to the first shift signal K<0> and generates the division signal DIV. The latch unit 610 may be implemented with a flip-flop configured to latch an input signal IN in response to the first shift signal K<0>, and generate the division signal DIV. The feedback unit 620 generates the input signal IN based on the division signal DIV. For example, the feedback unit 620 may be implemented with an inverter configured to invert the division signal DIV to generate the input signal IN.

In another embodiment of the present invention, it is possible to generate the division signal DIV by directly dividing the I/O strobe signal IO_STBP instead of the first shift signal K<0>.

Figure 7:
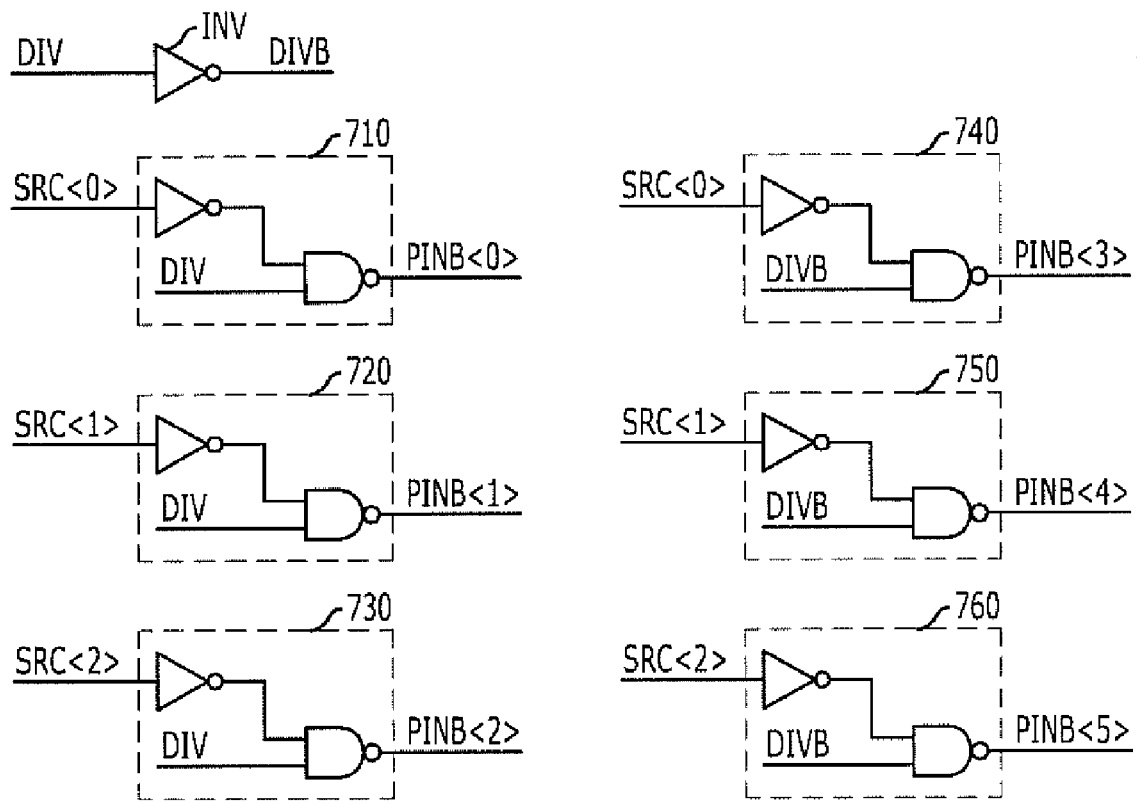
FIG. 7 is a circuit diagram illustrating a multiplexing unit shown in FIG. 4.

FIG. 7 is a circuit diagram illustrating the multiplexing unit 430 shown in FIG. 4.

The multiplexing unit 430 includes an inverter INV and a plurality of selection units 710 to 760. The inverter INV inverts the division signal DIV and generates an inverted division signal DIVB. The selection units 710 to 760 generate the pipe input control signal PINB<0:5> based on the source signal SRC<0:2> in response to the division signal DIV and the inverted division signal DIVB. Herein, for example, the first to third selection units 710 to 730 respectively output the source signal SRC<0:2> as the first to third pipe input control signals PINB<0:2> of the pipe input control signal PINB<0:5> in response to the division signal DIV. More specifically, when the division signal DIV has a logic high level, the first to third selection units 710 to 730 respectively output the source signal SRC<0:2> as the first to third pipe input control signals PINB<0:2> of the pipe input control signal PINB<0:5>. Meanwhile, the fourth to sixth selection units 740 to 760 respectively output the source signal SRC<0:2> as the fourth to sixth pipe input control signals PINB<3:5> of the pipe input control signal PINB<0:5> in response to the inverted division signal DIVB. More specifically, when the inverted division signal DIVB has a logic high level, the fourth to sixth selection units 740 to 760 respectively output the source signal SRC<0:2> as the fourth to sixth pipe input control signals PINB<3:5> of the pipe input control signal PINB<0:5>.

Figure 8:
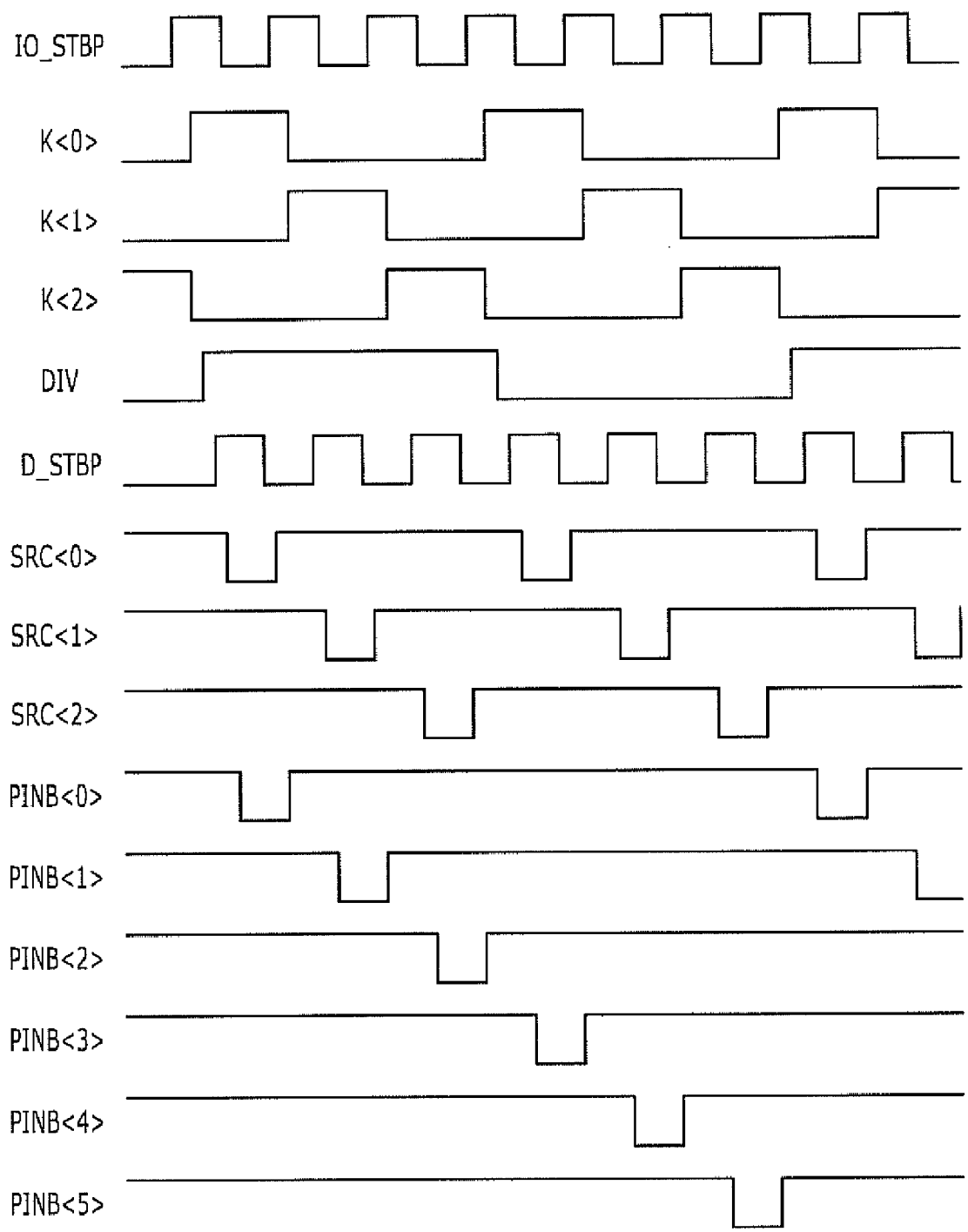
FIG. 8 is a waveform diagram describing an operation of the semiconductor memory device shown in FIGS. 4 to 7.

FIG. 8 is a waveform diagram describing an operation of the semiconductor memory device shown in FIGS. 4 to 7.

The three flip-flops included in the shift unit 510 sequentially perform a shift operation in response to the I/O strobe signal IO_STBP, and accordingly, each bit of the shift signal K<0:2> is sequentially activated. Before performing the shift operation, the flip-flops are reset in response to the reset signal RSTB. Herein, for example, the third shift signal K<2> may be reset to a logic high level, and the other shift signals K<0:1> may be reset to a logic low level.

The I/O strobe signal IO_STBP is delayed by the delay unit 520 and outputted as the delayed I/O strobe signal D_STBP. The delayed I/O strobe signal D_STBP and the shift signal K<0:2> are combined by the output unit 530 to generate the source signal SRC<0:2>. The reason for generating the source signal SRC<0:2> by using the delayed I/O strobe signal D_STBP instead of the I/O strobe signal IO_STBP is to obtain a time margin for combining the shift signal K<0:2>.

The multiplexing unit 430 outputs the source signal SRC<0:2> as the first to third pipe input control signals PINB<0:2> of the pipe input control signal PINB<0:5>, when the division signal DIV has the logic high level, and outputs the source signal SRC <0:2> as the fourth to sixth pipe input control signals PINB<3:5> of the pipe input control signal PINB<0:5>, when the inverted division signal DIVB has the logic high level.

In other words, the above-mentioned embodiment outputs a first counting value (i.e., the shift signal K<0:2>), generated by counting the I/O strobe signal IO_STBP during a first counting period where the division signal DIV has the logic high level, as the first to third pipe input control signals PINB<0:2> of the pipe input control signal PINB<0:5>. Further, the above-mentioned embodiment outputs a second counting value (i.e., the shift signals K<0:2>), generated by counting the I/O strobe signal IO_STBP during a second counting period where the division signal DIV has the logic low level, as the fourth to sixth pipe input control signals PINB<3:5> of the pipe input control signal PINB<0:5>. Herein, the division signal can also be generated by dividing the I/O strobe signal IO_STBP or any one of the signals of the shift signal K<0:2> (i.e., dividing a signal representing any bit of the shift signal K<0:2>).

The first and the second counting values (corresponding to PINB<0:2> and PINB<3-5> respectively) are then input to the pipe latch unit 440. The pipe latch unit 440 sequentially latches the data signals inputted through the global I/O line GIO in response to the pipe input control signal PINB<0:5> and outputs the data signals to the data pad 450 in response to the pipe output control signal POUT<0:5>.

As mentioned above, the embodiment of the present invention generates the pipe input control signal PINB<0:5> having a six bit width corresponding to the six pipe latches of the pipe latch unit 440 by using the source signal SRC<0:2> having a three bit width and the division signal DIV. Thus, the semiconductor memory device according to the embodiment of the present invention may include only four transmission lines for transmitting the source signal SRC<0:2> and the division signal DIV. Further, the source signal generation unit 410 is implemented with three flip-flops corresponding to the source signal SRC<0:2> with a three bit width. Therefore, the semiconductor memory device constructed according to the embodiments described herein may have a smaller chip size because of the reduced number of transmission lines and flip-flops.

While the present invention has been described with respect to the specific embodiments, it will be apparent to those skilled in the art that various changes and modifications may be made without departing from the spirit and scope of the invention as defined in the following claims.

What is claimed is:

1. A pipe latch circuit, comprising:
a division unit configured to output a division signal;
a multiplexing unit configured to multiplex a plurality of source signals in response to the division signal and generate a plurality of pipe input control signals; and
a pipe latch unit configured to sequentially latch a plurality of data signals in response to the pipe input control signals,
wherein the source signals are sequentially activated in response to an input/output (I/O) strobe signal.

2. The pipe latch circuit of claim 1, wherein a number of the source signals is less than a number of the pipe input control signals.

3. The pipe latch circuit of claim 1, further comprising a source signal generation unit configured to generate the source signals by counting the I/O strobe signal.

4. The pipe latch circuit of claim 3, wherein a number of transmission lines for transmitting the source signals is less than a number of pipe latches.

5. The pipe latch circuit of claim 3, wherein the source signal generation unit comprises:
a shift unit configured to perform a shift operation in response to the I/O strobe signal and generate a plurality of shift signals; and
an output unit configured to output the shift signals as the source signals in response to the I/O strobe signal.

6. The pipe latch circuit of claim 5, wherein the shift unit includes a plurality of flip-flops, wherein a number of the flip-flops is less than the number of the pipe latches.

7. The pipe latch circuit of claim 5, wherein the source signal generation unit further comprises a delay unit configured to generate a delayed I/O strobe signal by delaying the I/O strobe signal for a certain time and outputs the delayed I/O strobe signal to the output unit.

8. The pipe latch circuit of claim 5, wherein the division unit comprises:
a latch unit configured to latch an input signal in response to one of the shift signals and output the division signal; and
a feedback unit configured to output the division signal as the input signal of the latch unit.

9. The pipe latch circuit of claim 1, wherein the multiplexing unit comprises a plurality of selection units configured to generate the pipe input control signals based on the source signals in response to the division signal.

10. The pipe latch circuit of claim 1, wherein the I/O strobe signal is a control signal for transmitting the data signals loaded on a local I/O line to a global I/O line for a read operation.

11. An operation method of a pipe latch circuit, comprising:
   outputting a first count value, generated by counting an I/O strobe signal during a first period where a division signal has a first logic level, as a plurality of first pipe input control signals;
   outputting a second count value, generated by counting the I/O strobe signal during a second period where the division signal has a second logic level, as a plurality of second pipe input control signals; and
   sequentially latching a plurality of data signals in response to the first and second pipe input control signals.

12. The operation method of claim 11, wherein the division signal is generated by dividing the I/O strobe signal.

13. The operation method of claim 11, wherein the first and second count values are each generated by shifting a plurality of shift signals in response to the I/O strobe signal, wherein the plurality of shift signals are reset in response to a reset signal.

14. The operation method of claim 13, wherein the division signal is generated by dividing one of the plurality of shift signals.

15. The operation method of claim 11, wherein the I/O strobe signal is a control signal for transmitting the plurality of data signals loaded on a local I/O line to a global I/O line for a read operation.

* * * * *